(12) United States Patent
Scholz et al.

(10) Patent No.: US 7,221,004 B2
(45) Date of Patent: May 22, 2007

(54) SEMICONDUCTOR MODULE

(75) Inventors: Detlef Scholz, Soest (DE); Heinrich Gerstenkoeper, Warstein (DE)

(73) Assignee: Eupec Europaeische Gesellschaft Fuer Leistungshalbleiter MBH, Warstein (DE)

( * ) Notice: Subject to any disclaimer, the term of this patent is extended or adjusted under 35 U.S.C. 154(b) by 54 days.

(21) Appl. No.: 11/206,887

(22) Filed: Aug. 18, 2005

(65) Prior Publication Data

US 2006/0038268 A1 Feb. 23, 2006

Related U.S. Application Data

(63) Continuation of application No. PCT/EP04/01384, filed on Feb. 13, 2004.

(30) Foreign Application Priority Data

Feb. 18, 2003 (DE) .............................. 103 06 767

(51) Int. Cl.
    *H01L 29/74* (2006.01)
(52) U.S. Cl. ...................................... 257/181; 257/687
(58) Field of Classification Search ................ 257/181, 257/687
    See application file for complete search history.

(56) References Cited

U.S. PATENT DOCUMENTS 3,581,160 A    5/1971  Piccone et al. ......... 317/234 R
4,099,201 A    7/1978  Mueller ....................... 357/72
4,150,394 A    4/1979  Sugawa et al. .............. 357/74
4,399,452 A    8/1983  Nakashima et al. .......... 357/74
5,278,434 A  * 1/1994  Niwayama ................... 257/181

FOREIGN PATENT DOCUMENTS

DE     30 32 133 A1    3/1981
DE     26 52 348 C2    3/1990
EP     0 415 059 A2    3/1991

OTHER PUBLICATIONS

International Search Report; PCT/EP2004-001384; 4 pp, Jul. 22, 2004.
German Search Report; DE 103 06 767.1-33; 3 pp, Nov. 27, 2003.

* cited by examiner

*Primary Examiner*—Roy Karl Potter
(74) *Attorney, Agent, or Firm*—Baker Botts L.L.P.

(57) ABSTRACT

Disclosed is a semiconductor module comprising a semiconductor element (1) and two terminal electrodes (3a, 3b, 3c) between which the semiconductor element (1) is disposed and with which the semiconductor element (1) is contacted in an electrically conducting manner. The semiconductor element (1) is surrounded by an at least partly electrically insulating housing (5, 7, 11, 12). In order to protect the housing from the effect of electric arcs occurring in the event of an overload, a high temperature-resistant insulator which is arranged at least at some points between a housing wall and the semiconductor element is provided inside the module. The insulator can surround the semiconductor element as a hollow cylinder.

19 Claims, 1 Drawing Sheet

SEMICONDUCTOR MODULE

CROSS-REFERENCE TO RELATED APPLICATIONS

This application is a continuation of International Application No. PCT/EP2004/001384 filed Feb. 13, 2004, which designates the United States of America, and claims priority to German application number 103 06 767.1-33 filed Feb. 18, 2003, the contents of which are hereby incorporated by reference in their entirety.

TECHNICAL FIELD

The invention is used in technical fields in which power semiconductors are used to control high voltages, typically of several hundred or thousand volts, or high currents, typically several ten or hundred amperes. This is the case, for example, in the field of power supply or when driving powerful electrical machines such as, for example, motor drives.

The invention relates to a semiconductor module having a semiconductor element and two terminal electrodes between which the semiconductor element is arranged and to which the latter is electrically conductively contact-connected, the semiconductor element being surrounded by an at least partially electrically insulating housing. Such arrangements are disclosed, for example, in DE 30 32 133 and DE 26 52 348, wherein solid-filled housings are used to protect against arcs.

BACKGROUND

Switching devices for high voltages or high current intensities are usually in the form of mechanical switches in which two contacts are isolated from one another by moving at least one contact with generation of a spark or an arc. This requires the design and construction of a switch drive and also energy stores, catches and controllers for the drive and arc-resistant switching contacts.

The structural outlay for such switches can, in principle, be considerably reduced by using semiconductors. Semiconductors are also used in controllers in which it is not only important to switch a current on and off but also to control an electrical variable, rectify an alternating current or switch a current on and off in a very rapid and controlled manner.

However, the use of power semiconductors in high power ranges is demanding on account of the limited dielectric strength and current-carrying strength.

A high loading capacity is achieved, in a known manner, by using pressure-contact designs in the form of disk-type thyristors (presspack, hockey puck). This is known, for example, for thyristors and diodes. In this case, a semiconductor element is respectively installed in a housing having terminal contacts on both sides. In the event of an overload, an explosive plasma that can destroy the housing and pass to the outside forms in the interior of the housing, starting from the semiconductor element, on account of the high current density.

The design in pressure-contact housings is also known for IGBTs (IGBT=Insulated Gate Bipolar Transistor). However, the MOS structures (MOS=Metal Oxide Semiconductor) on the top side of the chip of IGBTs give rise to technological disadvantages. The production methods for IGBTs in pressure-contact housings are thus complicated.

SUMMARY

The present invention is based on the object of providing a semiconductor module, which has a high loading capacity in conjunction with a simple structural design and is easy to fit.

The object can be achieved by means of a semiconductor module comprising a semiconductor element and two terminal electrodes between which the semiconductor element is arranged and to which it is electrically connected, the semiconductor element being surrounded by an at least partially electrically insulating housing having walls, wherein within the housing, a high-temperature-resistant insulator that is in the form of a wall is arranged, at least partially, between an inner wall of the housing and the semiconductor element, and at least one inner cavity is provided between the inner wall of the insulator and at least parts of the terminal electrodes in order to propagate an arc.

At least one outer cavity can be provided between the outer wall of the insulator and the inner wall of the housing, the insulator being configured such that it is thermomechanically flexible. At least one of the terminal electrodes may project, at least partially, into the interior of the insulator. The inner wall of the insulator can be of cylindrical design. The insulator may surround the semiconductor element in an annular manner. The insulator may be composed of ceramic, glass and/or plastic. The wall thickness of the insulator can be thinner than the wall thickness of the housing. The inner cavity may have a smaller volume than the outer cavity. The terminal electrodes and/or the semiconductor element may bear a device for initiating an arc. The device for initiating an arc can be arranged in a region on the periphery of the semiconductor element, the region being shielded from the housing by the insulator. The insulator may surround the semiconductor element in an annular manner. Sections of the internal diameter of the insulator may correspond to the external dimensions of the semiconductor element, with the result that the insulator centers the semiconductor element. The insulator may have at least one shoulder or circumferential web, on which at least one of the terminal electrodes can be centered. At least one of the terminal electrodes may have a cylindrical outer flange, which has a cylinder-symmetrical profile for centering on the insulator, and, centrally within the profile, a circumferential groove for enlarging the space available to an arc within the insulator. At least one of the terminal electrodes may have a cylindrical outer flange, which has a cylinder-symmetrical profile for centering on the insulator, and, centrally within the profile, a circumferential profile for guiding an arc root. A terminal electrode having a cylindrical outer flange may have, on the periphery of the outer flange, a terminal plate, which is connected to the latter in a gas-tight manner and is intended to be connected to a cylindrical section of the housing in a gas-tight manner.

In this case, provision is made for a high-temperature-resistant insulator to be provided within the housing, the insulator being arranged, at least in places, between a wall of the housing and the semiconductor element, and at least one inner cavity being provided between the inner wall of the insulator and at least parts of the terminal electrodes of the semiconductor element in order to propagate an arc.

If an explosive plasma is produced as a result of the semiconductor module being overloaded on account of an excessively high current density and if an arc is formed between the terminal electrodes, the arc runs along the outside of the semiconductor element and bridges the latter. The term arc is to be understood, in this context, as also meaning relatively weak phenomena such as any type of discharge, in particular corona discharges. So that the housing is not damaged by the arc or its indirect and direct effects, provision is made of the high-temperature-resistant insulator, which protects the housing, at least partially, from the effects of the arc. The arc may cause damage, for example, as a result of its root migrating and collecting on sensitive conductive materials which are not resistant to erosion or are thin. In addition, the arc gives rise to explosion-like heating of the gas in the housing, with the result that a pressure wave is produced. Finally, the arc also gives rise to intense heating of the interior of the housing, as a result of which soldering points may be detrimentally affected, for example.

The inner cavity ensures that an arc that is, for example, burning finds sufficient space between the terminal electrodes and the cylindrical inner wall of the insulator to not only burn but also to sufficiently move, which results in the arc being swirled and cooled. The effect achieved by this is that the arc does not cause excessive damage in the region of the terminal electrodes and the semiconductor element as a result of remaining at a particular root for a long time.

All of these effects are at least partially mitigated by a high-temperature-resistant insulator if the latter is arranged between the inner wall of the housing and the arc and at least one inner cavity is provided between the inner wall of the insulator and at least parts of the terminal electrodes of the semiconductor element in order to propagate an arc.

It is even more advantageous if at least one outer cavity is provided between the outer wall of the insulator and the inner wall of the housing, the insulator being configured such that it is thermomechanically flexible. In this context, thermomechanically flexible means that, in the event of a change in temperature, the insulator is mechanically changed in such a manner that it becomes permeable at contact points, for example. The insulator (for example insulation ring) divides the housing into two large-volume cavities (chambers). The plasma jet that emerges in concentrated form is swirled in the inner chamber. As a result, its harmful form that has a large amount of energy at certain points is transformed into a large-volume less harmful form. At the same time, it can cool the swirled plasma at the freely accessible large-area contact areas before the insulation ring then thermomechanically yields and discharges the plasma cloud into the outer chamber. The plasma is then finally rendered harmless here by swirling and cooling.

In this case, at least one of the terminal electrodes projects, at least partially, into the interior of the insulator, in particular when the inner wall of the insulator is advantageously of cylindrical design and/or the insulator surrounds the semiconductor element in an annular manner.

The insulator is preferably composed of ceramic, glass and/or plastic. In addition, the wall thickness of the insulator may be thinner than the wall thickness of the housing and/or the inner cavity may have a smaller volume than the outer cavity.

Another advantageous refinement of the invention provides for the terminal electrodes and/or the semiconductor element to bear a device for initiating an arc.

Such a device for initiating an arc is not intended in principle, for instance, to give rise to an arc but rather to merely ensure that, in the event of overloading, when an arc or a discharge is produced anyway or is very likely to be produced, the latter is located at a very particular place, for example as a result of a sharp-edged increase at a terminal electrode, which increases the local field strength and can pull the root of an arc to it. This ensures that the arc, if it is burning, can be positioned where its effects on the housing can be reduced by suitable measures.

Another advantageous refinement of the invention provides for the device for initiating an arc to be arranged in a region on the periphery of the semiconductor element, said region being shielded from the housing by the insulator.

In the event of an arc occurring in the case of overloading, this measure protects the housing in the best possible manner from the destructive effect of said arc. The high-temperature-resistant insulator can be formed, for example, from a suitable ceramic, which, on the one hand, effectively shields the housing and, on the other hand, is itself only slightly damaged by the effects of the arc.

The invention may also be configured in an advantageous manner by the insulator surrounding the semiconductor element in an annular manner.

In this case, the housing is effectively protected, in the entire region of its cylindrical inner wall, by the high-temperature-resistant insulator irrespective of the position of an arc that occurs, for example, at the semiconductor element.

It may also be provided for the insulator to have the form of a hollow cylinder and to accommodate the semiconductor element in its interior.

As a result of the form of a hollow cylinder, the insulator can be produced in a particularly simple and cost-effective manner and can be effectively integrated in the structural design of the semiconductor module. If the hollow cylinder has a sufficient height, a sufficiently large interior space results in order to reliably accommodate and shield the semiconductor element.

Another advantageous refinement of the invention provides for the inner cavity to be provided between those parts of the terminal electrodes which project into the interior of the insulator and the cylindrical inner wall of the insulator in order to propagate an arc.

This design ensures that the arc, which will form its one root on one of the terminal electrodes, is also still surrounded by the insulator in the region of its root, with the result that the semiconductor element and, if appropriate, the housing are effectively protected from the effect of the arc.

In addition, suitable apparatuses such as sharp-edged webs on the terminal electrodes or guide devices on the inner wall of the insulator or on the outside of the semiconductor element can cause the roots and thus the arc as a whole to migrate for the purposes of effective cooling.

Provision may also be made for sections of the internal diameter of the insulator to correspond to the external dimensions of the semiconductor element, with the result that the insulator centers the semiconductor element.

If the internal diameter of the insulator partially corresponds to the external dimensions of the semiconductor element, effective centering and relative positioning of the semiconductor element and insulator are possible, which, on the one hand, facilitate fitting of the semiconductor module and, on the other hand, provide high mechanical stability.

Provision may also be made for the insulator to have at least one shoulder or circumferential web, on which at least one of the terminal electrodes can be centered.

This feature further facilitates fitting of the semiconductor module and means that the individual components of the module are positioned in a reproducible manner. In addition, if the insulator bears against one of the terminal electrodes, this terminates the arc space in the interior of the insulator, which prevents the arc at the terminal electrodes from passing out of the interior of the insulator and into the vicinity of the housing wall. The bearing of the insulator against the terminal electrodes is not gas-tight, with the result that gas may be exchanged there and the overpressure may also be reduced by an arc that occurs, for example, in the interior of the insulator. Only the arc itself is kept within the insulator.

Provision may additionally be made for at least one of the terminal electrodes to have a cylindrical outer flange, which has a cylinder-symmetrical profile for centering on the insulator, and, centrally within the profile, a circumferential groove for enlarging the space available to an arc within the insulator.

This measure provides the arc with an enlarged space between the terminal electrodes and the insulator, with the result that the arc can be swirled and cooled in a more effective manner in order to prevent damage to the semiconductor module.

Another advantageous refinement of the invention provides for at least one of the terminal electrodes to have a cylindrical outer flange, which has a cylinder-symmetrical profile for centering on the insulator, and, centrally within the profile, a circumferential profile for guiding an arc root.

Such a profile for guiding an arc root causes the root of the arc at a terminal electrode to deliberately migrate with the aim of effectively cooling the arc. Such a profile is, for example, a web, which has a rectangular cross section with sharp edges and runs round, in the manner of a spiral, on the end side of the terminal electrode.

A particularly simple design (which is easy to fit) of a semiconductor module according to the invention results from the fact that a terminal electrode having a cylindrical outer flange has, on the periphery of the outer flange, a terminal plate, which is connected to the latter in a gas-tight manner and is intended to be connected to a cylindrical section of the housing in a gas-tight manner.

The terminal plate may, for example, be concomitantly integrally formed during production of a terminal electrode using the deep-drawing method. In order to assemble the semiconductor module, the terminal electrodes, the insulator and the semiconductor element may then be stacked, said components being automatically centered on one another, and it finally being necessary to merely solder or adhesively bond the terminal plate to the outer housing, that is to say to a metal part or, for example, a ceramic part of the outer housing, in a gas-tight manner.

BRIEF DESCRIPTION OF THE DRAWINGS

The invention will be explained in more detail below with reference to the exemplary embodiments which are illustrated in the figures of the drawing, in which.

DETAILED DESCRIPTION

Figure 1:
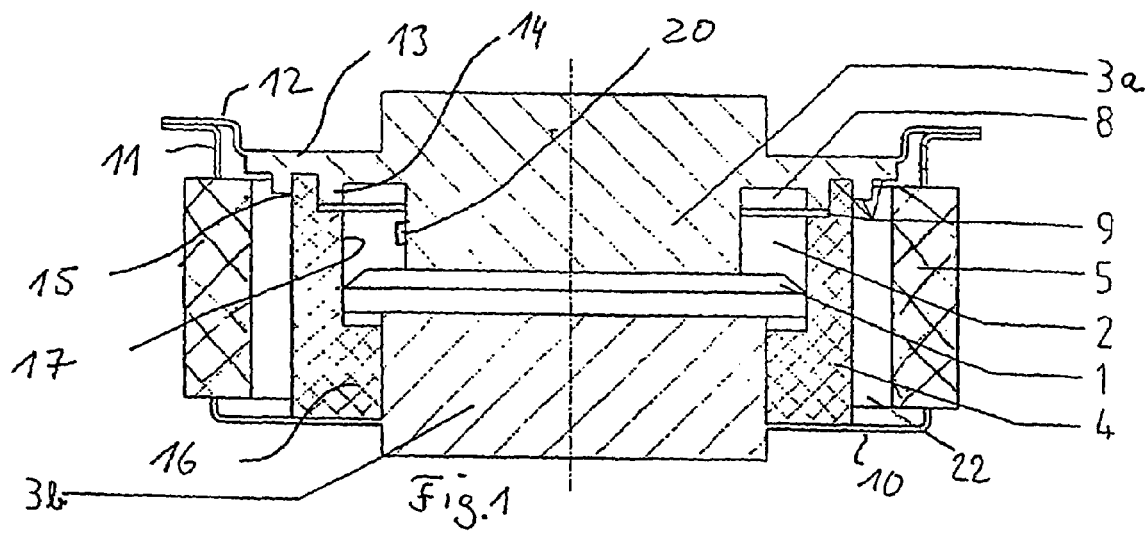
FIG. 1 shows a semiconductor module having an asymmetrical insulator and an asymmetrical housing.

FIG. 1 shows a semiconductor module, in which provision is made of a cylindrical semiconductor element 1, which is beveled on its upper circumferential edge, is situated between a first terminal electrode 3a and a second terminal electrode 3b and is electrically contact-connected between said electrodes by means of pressure. The terminal electrodes 3a, 3b are likewise of cylindrical design.

Provision is also made of a housing having a housing insulator 5 whose underside is soldered to a circular electrically conductive plate 10, which is connected to the second terminal electrode 3b in a gas-tight manner. The other end side of the housing insulator 5 is connected to a housing plate 11 in a gas-tight manner, said housing plate being soldered, welded or adhesively bonded to a terminal plate 12 in a gas-tight manner during fitting of the semiconductor module. The terminal plate 12 is connected to the outer flange 13 of the first terminal electrode 3a.

In the region of its outer flange 13, the first terminal electrode 3a has a circumferential web 14, which is centered on one shoulder 15 of the insulator 4.

At its end remote from the shoulder 15, the insulator 4 has a section 16 of reduced internal diameter, into which the second terminal electrode 3b is fitted with an accurate fit.

The diameter of the semiconductor element 1 is configured in such a manner that the semiconductor element can be centered on the cylindrical inner wall 17 of the insulator 4.

Formed between the first terminal electrode 3a and the insulator 4, according to the invention, is an inner arc space 2 (cavity, chamber), in which an arc, which is burning between the second terminal electrode 3b and the first terminal electrode 3a and forms beyond the outside of the semiconductor element 1, can be swirled. The groove 8 in the outer flange 13 of the first terminal electrode 3a additionally enlarges this arc space.

At least one chamber 22 in the form of an outer cavity is also provided between the outer wall of the insulator 4 and the inner wall of the housing 5, the insulator 4 being configured such that it is thermomechanically flexible.

A so-called labyrinth, that is to say a region that is permeable to gas but keeps the arc in the arc space 2, is formed where the insulator 4 butts against the first terminal electrode 3a in the region designated with the reference symbol 9. Thermomechanically flexible means that, in the event of a change in temperature, the insulator 4 is mechanically changed in such a manner that it becomes permeable at these contact points, for example, as a result of the contact point being opened slightly.

The insulator 4 divides the housing into two large-volume cavities (chambers). The plasma jet that emerges in concentrated form is swirled in the inner cavity (arc space 2). As a result, its harmful form that has a large amount of energy at certain points is transformed into a large-volume less harmful form. At the same time, it can cool the swirled plasma at the freely accessible large-area contact areas before the insulator 4 then thermomechanically yields and discharges the plasma cloud into the outer cavity (chamber 22). The plasma is then finally rendered harmless here by swirling and cooling.

In this way, the housing 5, 7, 10 is protected from the effects of the arc.

Figure 2:
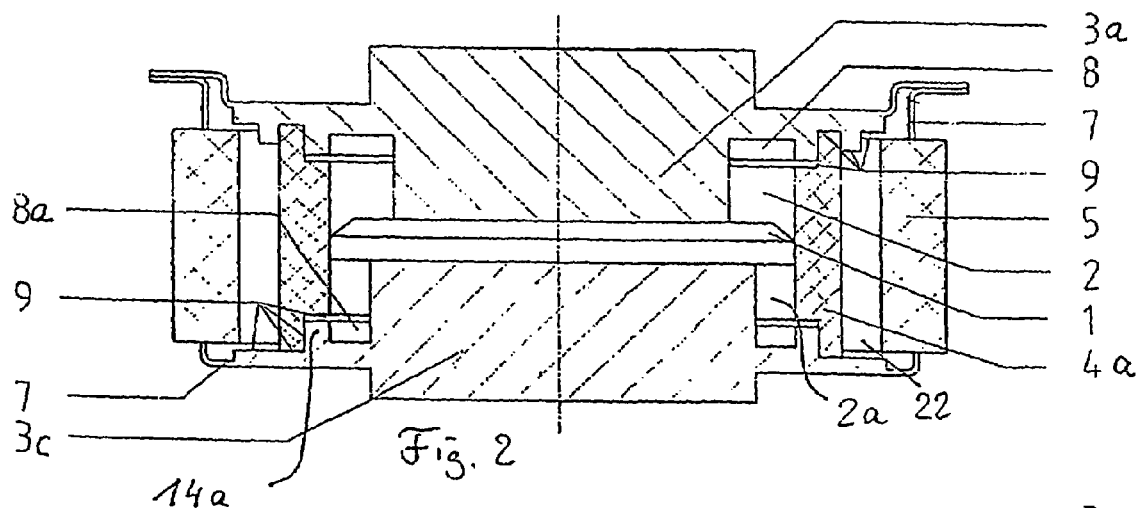
FIG. 2 shows a semiconductor module having a symmetrical insulator and an asymmetrical housing.

In accordance with FIG. 2, in a design of the semiconductor module that is somewhat changed in comparison with FIG. 1, a second terminal electrode 3c, which has a groove 8a for enlarging the arc space 2a and a web 14a for centering the symmetrical insulator 4a, is assigned to the first terminal electrode 3a. In this refinement, the space 2, 2a available to the arc overall is enlarged in comparison with the exemplary embodiment from FIG. 1.

Figure 3:
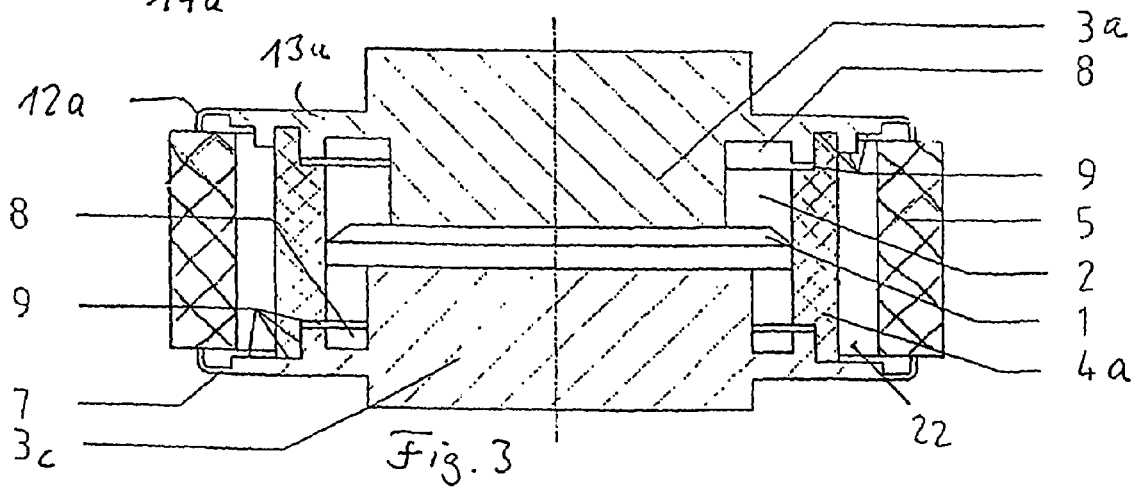
FIG. 3 shows a semiconductor module having a symmetrical insulator and a symmetrical housing.

As regards the enlargement of the arc space and the symmetrical configuration of the insulator 4a, the exemplary embodiment from FIG. 3 is similar to the exemplary embodiment illustrated in FIG. 2 but the outer flange 13a of the first terminal electrode 3a is directly connected, for example soldered, to the insulator 5 of the housing in the region of the terminal plate 12a. Soldering techniques for soldering ceramic and metal sheets in a gas-tight manner are available from the prior art for this purpose.

The common feature of the designs illustrated here is that, except for manufacturing tolerances being compensated for by the dimensions of the individual components and said components being matched to one another, fitting is possible in only one manner and can be easily carried out in a self-centering manner. Errors can thus be largely excluded during fitting and fitting can be carried out essentially automatically.

The design achieves a high loading capacity and a long service life of the semiconductor module.

What is claimed is:

1. A semiconductor module comprising a semiconductor element and two terminal electrodes between which the semiconductor element is arranged and to which it is electrically connected, the semiconductor element being surrounded by an at least partially electrically insulating housing having walls, wherein
within the housing, a high-temperature-resistant insulator that is in the form of a wall is arranged, at least partially, between an inner wall of the housing and the semiconductor element, and
at least one inner cavity is provided between the inner wall of the insulator and at least parts of the terminal electrodes in order to propagate an arc.

2. The semiconductor module according to claim 1, wherein at least one outer cavity is provided between the outer wall of the insulator and the inner wall of the housing, the insulator being configured such that it is thermomechanically flexible.

3. The semiconductor module according to claim 1, wherein at least one of the terminal electrodes projects, at least partially, into the interior of the insulator.

4. The semiconductor module according to claim 1, wherein the inner wall of the insulator is of cylindrical design.

5. The semiconductor module according to claim 4, wherein the insulator surrounds the semiconductor element in an annular manner.

6. The semiconductor module according to claim 1, wherein the insulator is composed of ceramic, glass and/or plastic.

7. The semiconductor module according to claim 1, wherein the wall thickness of the insulator is thinner than the wall thickness of the housing.

8. The semiconductor module according to claim 1, wherein the inner cavity has a smaller volume than the outer cavity.

9. The semiconductor module according to claim 1, wherein the terminal electrodes and/or the semiconductor element bear(s) a device for initiating an arc.

10. The semiconductor module according to claim 1, wherein the device for initiating an arc is arranged in a region on the periphery of the semiconductor element, said region being shielded from the housing by the insulator.

11. The semiconductor module according to claim 1, wherein the insulator surrounds the semiconductor element in an annular manner.

12. The semiconductor module according to claim 1, wherein sections of the internal diameter of the insulator correspond to the external dimensions of the semiconductor element, with the result that the insulator centers the semiconductor element.

13. The semiconductor module according to claim 12, wherein the insulator has at least one shoulder or circumferential web, on which at least one of the terminal electrodes can be centered.

14. The semiconductor module according to claim 12, wherein at least one of the terminal electrodes has a cylindrical outer flange, which has a cylinder-symmetrical profile for centering on the insulator, and, centrally within the profile, a circumferential groove for enlarging the space available to an arc within the insulator.

15. The semiconductor module according to claim 12, wherein at least one of the terminal electrodes has a cylindrical outer flange, which has a cylinder-symmetrical profile for centering on the insulator, and, centrally within the profile, a circumferential profile for guiding an arc root.

16. The semiconductor module according to claim 14, wherein a terminal electrode having a cylindrical outer flange has, on the periphery of the outer flange, a terminal plate, which is connected to the latter in a gas-tight manner and is intended to be connected to a cylindrical section of the housing in a gas-tight manner.

17. The semiconductor module according to claim 15, wherein a terminal electrode having a cylindrical outer flange has, on the periphery of the outer flange, a terminal plate, which is connected to the latter in a gas-tight manner and is intended to be connected to a cylindrical section of the housing in a gas-tight manner.

18. A semiconductor module comprising:
two terminal electrodes;
a semiconductor element arranged between the two terminal electrodes and electrically coupled with the terminal electrodes,
an at least partially electrically insulating housing having walls surrounding the semiconductor element,
a high-temperature-resistant insulator in the form of a wall arranged, at least partially, between an inner wall of the housing and the semiconductor element, and
at least one inner cavity between the inner wall of the insulator and at least parts of the terminal electrodes in order to propagate an arc.

19. A semiconductor module comprising:
two terminal electrodes,
a semiconductor element arranged between the two terminal electrodes and electrically coupled with the terminal electrodes,
an at least partially electrically insulating housing having walls surrounding the semiconductor element,
a high-temperature-resistant insulator being thermomechanically flexible in the form of a wall arranged, at least partially, between an inner wall of the housing and the semiconductor element, wherein at least one of the terminal electrodes projects, at least partially, into the interior of the insulator,
at least one inner cavity between the inner wall of the insulator and at least parts of the terminal electrodes in order to propagate an arc,
at least one outer cavity between the outer wall of the insulator and the inner wall of the housing, the insulator.

* * * * *